United States Patent
Barclay et al.

(10) Patent No.: US 7,700,256 B2
(45) Date of Patent: *Apr. 20, 2010

(54) PHENOLIC/ALICYCLIC COPOLYMERS AND PHOTORESISTS

(75) Inventors: George G. Barclay, Jefferson, MA (US); Ashish Pandya, Natick, MA (US); Wang Yueh, Shrewsbury, MA (US); Anthony Zampini, Westborough, MA (US); Gary Ganghui Teng, Northborough, MA (US); Zhibiao Mao, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 307 days.

This patent is subject to a terminal disclaimer.

(21) Appl. No.: 10/313,954

(22) Filed: Dec. 6, 2002

(65) Prior Publication Data

US 2003/0207200 A1  Nov. 6, 2003

Related U.S. Application Data

(63) Continuation of application No. 09/414,738, filed on Oct. 8, 1999, now Pat. No. 6,492,086.

(51) Int. Cl.
  *G03F 7/004* (2006.01)
  *G03F 7/30* (2006.01)
(52) U.S. Cl. ............ 430/270.1; 430/326; 430/905; 430/910
(58) Field of Classification Search ........... 430/270.1, 430/905, 910, 326, 18
See application file for complete search history.

(56) References Cited

U.S. PATENT DOCUMENTS

| 5,443,690 | A | 8/1995 | Takechi et al. ........... 430/286.1 |
| 5,635,332 | A | 6/1997 | Nakano et al. ........... 430/270.1 |
| 5,962,184 | A | 10/1999 | Allen et al. ............... 430/270.1 |
| 5,968,713 | A | 10/1999 | Nozaki et al. ............... 430/326 |
| 6,077,643 | A | 6/2000 | Kumar et al. ............. 430/270.1 |
| 6,165,678 | A * | 12/2000 | Allen et al. ............... 430/270.1 |
| 6,312,867 | B1 | 11/2001 | Kinsho et al. ............ 430/270.1 |
| 6,365,321 | B1 * | 4/2002 | Chen et al. .............. 430/270.1 |
| 6,770,413 | B1 * | 8/2004 | Ito et al. .................. 430/270.1 |

FOREIGN PATENT DOCUMENTS

| DE | 44 09 220 A | 11/1994 |
| DE | 195 25 221 A1 | 7/1995 |
| DE | 196 26 003 A1 | 6/1996 |
| DE | 196 26 003 A | 1/1997 |
| EP | 0 663 616 A2 | 7/1995 |
| EP | 0 915 382 A2 | 5/1999 |
| EP | 0 930 542 A1 | 7/1999 |
| EP | 1 004 568 A | 5/2000 |
| JP | 11-171932 | 6/1999 |

* cited by examiner

*Primary Examiner*—John S Chu
(74) *Attorney, Agent, or Firm*—Peter F. Corless; Darryl P. Frickey; Edwards Angell Palmer & Dodge LLP

(57) ABSTRACT

The present invention relates to new polymers that contain repeat units of phenol and photoacid-labile esters that contain an alicyclic group, preferably a bulky group that suitably may contain 7 to about 20 carbons, such as an alkyladamantyl, ethylfencyl, tricyclo decanyl, or pinanyl group. Polymers of the invention are useful as a component of chemically-amplified positive-acting resists.

15 Claims, No Drawings

PHENOLIC/ALICYCLIC COPOLYMERS AND PHOTORESISTS

This application is a continuation of application Ser. No. 09/414,738 filed on Oct. 8, 1999 now U.S. Pat. No. 6,492,086

BACKGROUND OF THE INVENTION

1. Field of the Invention

The present invention relates to new polymers that contain repeat units of phenol and photoacid-labile esters that contain a tertiary ester alicyclic hydrocarbon group. Polymers of the invention are particularly useful as a component of chemically-amplified positive-acting resists.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their teaching of photoresist compositions and methods of making and using the same.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., *Proceedings of SPIE*, 2724:334-343 (1996); and P. Trefonas et al. *Proceedings of the 11$^{th}$ International Conference on Photopolymers (Soc. Of Plastics Engineers)*, pp 44-58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). Use of such short exposure wavelengths can enable formation of smaller features. Accordingly, a photoresist that yields well-resolved images upon 248 nm or 193 nm exposure could enable formation of extremely small (e.g. sub-0.25 µm) features that respond to constant industry demands for smaller dimension circuit patterns, e.g. to provide greater circuit density and enhanced device performance.

However, many current photoresists are generally designed for imaging at relatively higher wavelengths, such as I-line (365 nm) and G-line (436 nm) exposures and are generally unsuitable for imaging at short wavelengths such 248 nm. In particular, prior resists exhibit poor resolution (if any image at all can be developed) upon exposure to these shorter wavelengths.

Additionally, many photoresists will not provide images of sufficient resolution required for many high performance applications. For instance, coating layers of current photoresists often have excessive loss of unexposed areas in developer solutions (known as "UFTL" or unexposed film thickness loss), thereby significantly compromising resolution of the developed resist image. For example, high UFTL, particularly in thin film resist applications, can result in low contrast images with rounded or angular profiles Many current photoresists also may exhibit relatively poor resistance to etchants employed after development, which also can dramatically compromise resolution of the feature transferred to the patterned substrate.

It thus would be desirable to have new photoresist compositions, particularly resist compositions that can be imaged at short wavelengths such as 248 nm. It would be particularly desirable to have such resist compositions that can provide high resolution relief images.

SUMMARY OF THE INVENTION

We have now found novel polymers and photoresist compositions that comprise the polymers as a resin binder component. Polymers of the invention contain repeat units of both 1) phenolic groups and 2) acid labile ester groups that contain a tertiary ester alicyclic hydrocarbon group that has a molecular volume of at least about 125 cubic angstroms ($Å^3$), and preferably has two or more fused or bridged rings. Preferred tertiary ester groups include optionally substituted fencyl groups, particularly ethyl fencyl; optionally substituted alkyl adamantyl, particularly a methyladamantyl leaving group (where the ester oxygen is linked to the tertiary carbon of the methyladamantyl moiety); optionally substituted tricyclo decanyl; and optionally substituted pinanyl. The photoresist compositions of the invention can provide highly resolved relief images upon exposure to short wavelengths, including sub-300 nm and sub-250 nm wavelengths such as 248 nm.

Moreover, we have surprisingly found that significantly enhanced lithographic performance and reduced UFTL can be provided by resists of the invention. See, for instance, the results of Example 11 which follows.

It also has been surprisingly found that polymers of the invention exhibit surprisingly enhanced contrast between exposed and unexposed regions of a resist coating layer, and significantly enhanced resolution, e.g. relative to a comparable phenolic/alkylester copolymer that does not contain alicyclic groups (e.g. a phenolic/t-butyl acrylate copolymer).

Without being bound by theory, it is believed that the relatively bulky alicyclic groups can effectively "shield" adjacent phenolic groups from interaction with and dissolution by aqueous alkaline developer. Hence, in unexposed coating layer regions, the resist has a relatively low dissolution in alkaline developer. However, in exposed regions, the alicyclic group is removed to provide a polar —COO⁻ moiety, and the phenolic groups are "de-shielded", to thereby together provide a relatively high dissolution rate in alkaline developer. Consequently, significant solubility differentials between exposed and unexposed resist areas can be realized.

Preferably, particularly to provide reduced UFTL, polymers of the invention will contain a major portion of phenolic units. More specifically, preferred polymers of the invention contain at least about 30 or 40 percent phenolic groups, more preferably at least about 50, 60, 70, 75 or 80 mole percent phenolic groups, with the balance being optionally substituted alicyclic acid labile groups or other groups. Particularly preferred polymers of the invention contain from about 30 or 40 to 80 or 85 mole percent phenolic groups, and from about 5, 10, 15, 20, 25, 30, 40 or 50 mole percent acid labile groups with an alicyclic ester moiety. Particularly preferred polymers of the invention contain from about 65, 70, 80 or 85 mole percent of phenolic units, with the balance alicyclic ester units.

We have also surprisingly found that resists of the invention can exhibit even further enhanced resolution, particularly reduced line edge roughness, where the resist deblocking polymer of the invention contains a phenolic groups that contains a meta-OH group. For such polymers, typically a mixture of meta-phenol and para-phenol will be employed. For example, an amount equal mixture (50:50 molar ratio) of meta-hydroxyphenol and para-hydroxyphenol can be employed, or a greater portion of an position isomer than the other, e.g. use of a 2:1, 3:1, 4:1 molar ratio of para-hydroxyphenol:meta-hydroxyphenol, or a 2:1, 3:1, 4:1 molar ratio of meta-hydroxyphenol:para-hydroxyphenol. One preferred meta-phenol polymer has had units of para-hydroxystyrene:meta-hydroxystyrene:alicyclic (MAMA) ester at a respective molar ratio of 40:40:20. Another preferred meta-phenol polymer has had units of para-hydroxystyrene:meta-hydroxystyrene:alicyclic (MAMA) ester at a respective molar ratio of 50:20:30.

Additionally, we have found that use of a photoacid labile ester group that contains a fencyl group, particularly ethylfencyl, provides a resist system that can be deprotected at relatively lower temperatures (lower activation energy required). More particularly, it has been found that resists of the invention that contain a polymer having phenolic units and photoacid labile ester units having ethylfencyl leaving groups can provide high resolution relief images (e.g. sub-quarter micron) with post-exposure bakes (ca. 60 seconds duration) of no more than 110° C., or even no more than about 100° C. or 90° C.

Polymers of the invention also may contain units in addition to phenolic groups 1) and alicyclic acid labile groups 2). For example, dissolution enhancers may be included in a polymer of the invention, such as anhydrides and lactones. Contrast enhancing groups also may be present in polymers of the invention, such as groups provided by polymermization of methacrylic acid, acrylic acid, and such groups protected with photoacid labile groups e.g. ethoxyethyl methacrylate, t-butoxy methacrylate, t-butylmethacrylate and the like. Groups that are essentially inert to photolithography also may be employed, such as carbocyclic aryl groups, particularly phenyl groups, which may be provided by reaction of styrene, and phenyl or other aryl groups that are optionally substituted by moieties that are essentially unreactive to thermal (e.g. between about 150 to 200° C.) and photoacid conditions of photolithography.

As indicated above, preferred polymers of the invention exhibit quite low dissolution rates prior to photoacid-induced deprotection, e.g. in a standard aqueous base dissolution characterization protocol, typically less than about 10 angstroms per second in 0.26N tetramethylammonium hydroxide aqueous solution, more typically about 5 or less angstroms per second dissolution in 0.26N tetramethylammonium hydroxide aqueous solution. References herein to "a standard aqueous base dissolution characterization protocol", or other similar phrase, designate the following test conditions: a liquid coating composition of the polymer is spin coated onto silicon wafers and solvent removed at 130° C. for 1 minute. Polymer dried film thickness is about 1.0 μM. Dissolution rates of the polymer films are measured by immersion of the coated wafer in the specified developer (e.g. as above, 0.26N tetramethylammonium hydroxide aqueous solution) such as by using a Perkin-Elmer 5900 Development Rate Monitor.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention.

Other aspects of the invention are disclosed infra.

DETAILED DESCRIPTION OF THE INVENTION

As stated above, polymers of the invention comprise contain repeat units of both phenol groups and acid labile ester groups with a tertiary alicyclic hydrocarbon ester moiety, particularly a polycyclic ester such as methyladamantyl moiety, ethylfencyl moiety, tricyclo decanyl moiety, or a pinanyl moiety. References herein to a "tertiary alicyclic ester group" or other similar term indicate that a tertiary carbon of an alicyclic moiety is covalently linked to the ester oxygen, i.e. —C(=O))O-TR where T is a tertiary carbon of alicyclic group R. In at least many cases, preferably a tertiary ring carbon (i.e. endocyclic carbon) of the alicyclic moiety will be covalently linked to the ester oxygen, such as exemplified by the below depicted methyladamanytl acrylate groups. However, the tertiary carbon linked to the ester oxygen also can be exocyclic to the alicyclic ring, typically where the alicyclic ring is one of the substituents of the exocyclic tertiary carbon (see for instance the substituted cyclohexyl group below having a molecular volume of 161 Å$^3$). Typically, the tertiary carbon linked to the ester oxygen will be substituted by the alicyclic ring itself, and/or one, two or three alkyl groups having 1 to about 12 carbons, more typically 1 to about 8 carbons, even more typically 1, 2, 3 or 4 carbons. The alicyclic group also will not contain aromatic substitution.

Acrylate-containing polymers are generally preferred, such as may be provided by reaction of methyladamantyl methacrylate or methyladamantylacrylate, i.e. the following compounds:

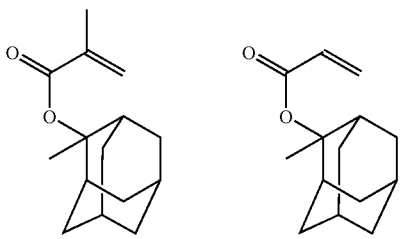

Preferred polymers include those of the following Formula I:

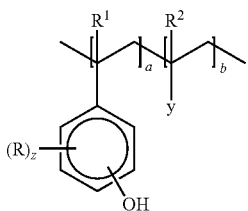

I $R^1$ and $R^2$ are each independently hydrogen or optionally substituted alkyl such as $C_{1-6}$ alkyl, and preferably $R^1$ and $R^2$ are each independently hydrogen or methyl;

each R is the same or different non-hydrogen phenyl ring substituent that is preferably essentially non-reactive to photogenerated acid and may be e.g. halogen (F, Cl, Br or 1); nitro; cyano; hydroxyl; alkylsulfonyl preferably having 1 to about 20 carbon atoms; optionally substituted alkyl preferably having 1 to about 8 carbon atoms; optionally substituted alkoxy preferably having 1 to about 8 carbon atoms; optionally substituted carbocyclic aryl such as phenyl; and the like;

Y is an optionally substituted alicyclic group, preferably a fused or bridged ring system (particularly a bicyclic or tricyclic ring system) having 7 to about 20 carbons, such as optionally substituted fencyl preferably ethylfencyl, optionally substituted adamantyl preferably 2-methyladamantyl, and optionally substituted tricyclo decanyl, particularly 8-methyltricyclodecanyl;

z is an integer of from 0 (where the phenyl ring is fully hydrogen substituted) to 4, and preferably z is 0, 1 or 2;

a is the mole percent of the depicted phenolic units and is preferably 20 to 80 mole percent based on total polymer units, or other preferred value as discussed above; and b is the mole percent of the photoacid labile ester groups and is preferably 20 to 80 mole percent based on total polymer units, or other preferred value as discussed above.

The sum of a and b in Formula I above typically will be at least about 50 mole percent of total units of the polymer, more typically at least about 60, 70, 80, 90 or 95 mole percent of total units of the polymer. In Formula I, the phenolic units are typically meta or para-substituted by a hydroxyl group, more typically para-substituted.

Particularly preferred polymers of the invention include those that contain only phenol and alicyclic acid labile groups, such as compounds of the following Formula II:

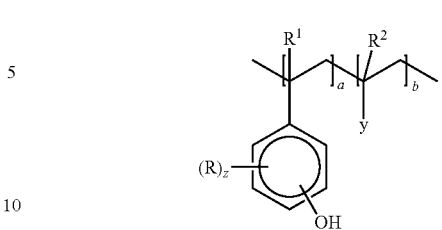

II wherein $R^1$, $R^2$, R, Y, a and b are the same as defined above for Formula I, and the sum of a and b is about 100 percent. Preferably, $R^1$ and $R^2$ are each independently hydrogen or methyl, and z is 0, 1 or 2.

As discussed above, additional preferred polymers of the invention may include additional units, including that are essentially unreactive to typical photolithographic conditions (i.e. heat and photoacid), or other units such as a lactone unit. In particular, polymers of the following Formula III are preferred:

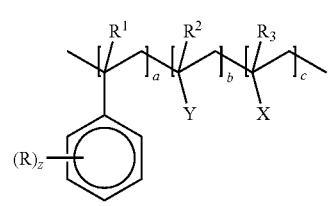

III wherein $R^1$, $R^2$, R, Y, z, a and b are the same as defined above for Formula I;

$R^3$ is hydrogen or $C_{1-6}$ alkyl, preferably hydrogen or methyl;

X is a group that is typically unreactive to lithographic conditions, particularly heat (e.g. 150° C. and above) and photoacid, and includes optionally substituted phenyl and cyano; or a lactone group such as butyrolactone; or an anhydride such as itaconic anhydride, which preferably has been purified;

c is the mole percent of the units X, and suitably is at least one percent, and more typically is from about 1 to 50 mole percent, more typically 1 to about 30 or 40 mole percent, even more typically 5 to about 15, 20, 25 or 30 mole percent;

In Formula III, the sum of a, b and c preferably is at least about 50 mole percent, more typically the sum of a, b and c will be at least 60, 70 or 80 mole percent, and preferably may be about 90, 95, 98 or 100 mole percent.

As discussed, various moieties described herein, including moieties of polymer of Formulae I, II and/or III may be optionally substituted. A "substituted" group may be substituted at one or more available positions, typically 1, 2, or 3 positions by one or more suitable groups such as e.g. halogen (particularly F, Cl or Br); cyano; nitro; $C_{1-6}$alkyl sulfonyl such as mesyl; $C_{1-8}$ alkyl; $C_{1-8}$ alkoxy; $C_{2-8}$ alkenyl; $C_{2-8}$ alkynyl; hydroxyl; alkanoyl such as a $C_{1-6}$ alkanoyl e.g. acyl and the like; etc.

Particularly preferred polymers of the invention include the following, which may optionally comprise additional polymer units such as those disclosed above, but preferably will comprise 90 mole percent or greater of the below depicted units, more preferably 95 or greater of the below depicted units, or consist of only the below depicted units.

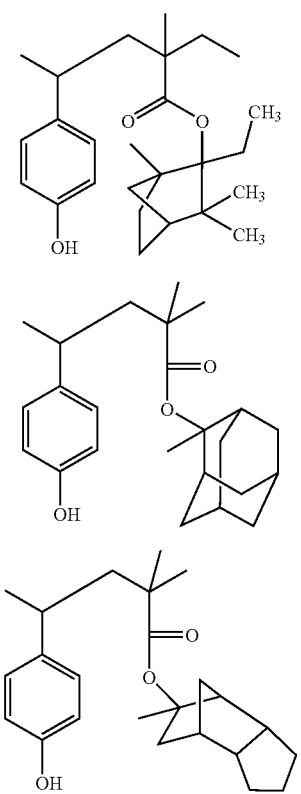

(1) Poly(4-hydroxystyrene-co-ethyl fenchol methacrylate)
(2) Poly(4-hydroxystyrene-co-2-methyladamantyl methacrylate)
(3) Poly(4-hydroxystyrene-co-8-methyltricyclodecanyl methacrylate)

Additional preferred polymers correspond to those above (1), (2) and (3) polymers, but have alternate alkyl substitution at the tertiary carbon that is linked to the ester oxygen, particularly other $C_{1-8}$ alkyl substitution, more typically other $C_{1-6}$ alkyl substitution.

Preferred alicyclic moieties of photoacid labile ester groups of polymers of the invention have rather large volume. As discussed above, without being bound by theory, it is believed that the bulky alicyclic groups provide enhanced contrast and resolution when used in the phenolic copolymers of the invention.

More particularly, preferred alicyclic groups of photoacid labile ester groups will have a molecular volume of at least about 125 or about 130 $Å^3$, more preferably a molecular volume of at least about 135, 140, 150, 155, 160, 165, 170, 175, 180, 185, 190, 195, or 200 $Å^3$. Alicyclic groups larger than about 220 or 250 $Å^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

Some preferred alicyclic groups of acid labile esters of the invention are shown immediately below together with the ester oxygen linkage. The substituent R shown in the following structures is suitably $C_{1-8}$ alkyl, more typically $C_{1-6}$ alkyl such as methyl, ethyl, propyl, butyl, pentyl and the like.

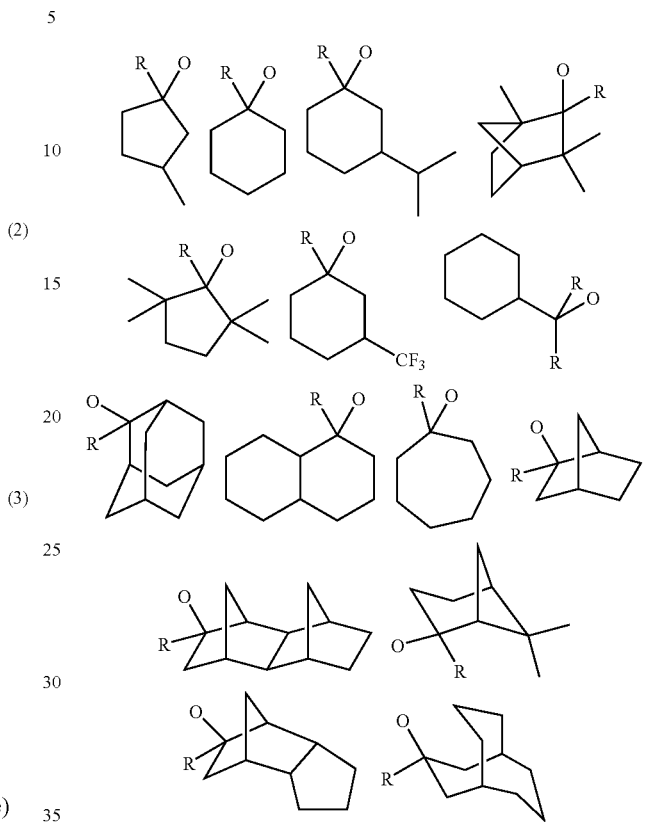

Some specifically preferred alicyclic groups of acid labile esters of the invention are shown immediately below together with the ester oxygen linkage, and with volumetric size values ($Å^3$) listed to the right of the alicyclic group.

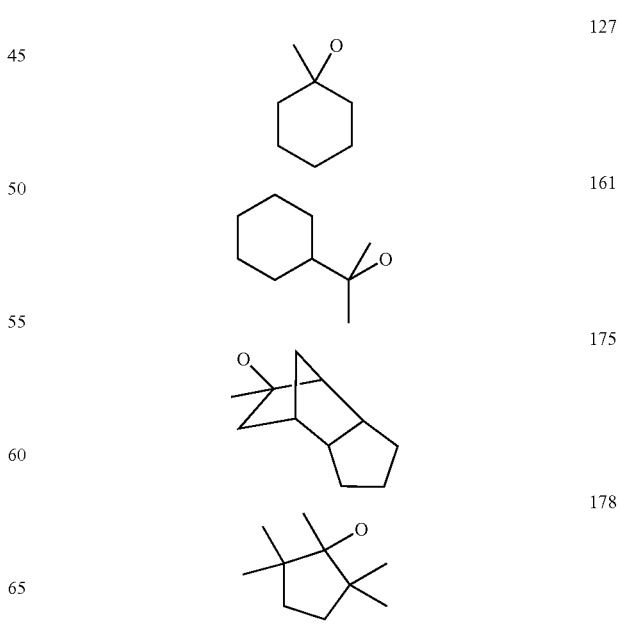

-continued

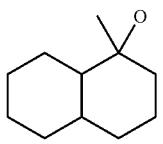
183

197

128

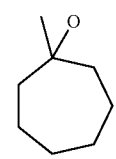
144

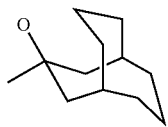
196

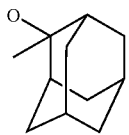
172

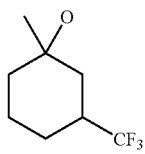
155

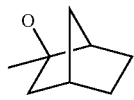
134

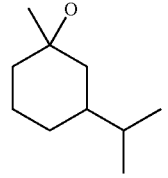
178

168

As discussed above, even further enhanced lithographic results can be achieved by use of meta-phenol in the polymer of the invention. Typically, the meta-phenol will be employed in combination with para-phenol units, although a copolymer where the only phenolic units are meta-isomers also can be employed. If meta-phenolic units are employed, typically the polymer will contain at least 1, 2 or 3 mole percent of meta-phenol units, more typically about 5, 8, 10, 15, 25, 30 or 40 mole percent of meta-phenol units. Such meta-phenol units can be readily provided, e.g. by reaction of meta-hydroxystyrene or meta-hydroxy-alphamethylsytrene.

Polymers of the invention can be prepared by a variety of methods. One suitable method is an addition reaction which may include free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, ethyl lactate and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed. See the examples which follow for exemplary reaction conditions.

Suitable monomers for reaction to provide polymers of the invention include 2-methyladamantylmethacrylate; 2-methyladamantylacrylate; 8-methyltricyclodecanyl methacrylate; ethyl fencyl methacrylate; ethyl fencyl acrylate; optionally substituted vinyl phenyl; optionally substituted styrene; optionally substituted alpha-methyl styrene; methacrylonitrile; acrylonitrile; itaconic anhydride which preferably has been purified such as by extraction with chloroform; or a alpha-butyrolactone methacrylate.

Other monomers that can be reacted to provide a polymer of the invention can be identified by those skilled in the art. For example, to provide other acid labile groups than MAMA-based units, other corresponding monomers can be reacted such as t-butymethacrylate, t-butylacrylate, t-butoxy methacrylate, t-butylmethacrylate; ethoxyethyl methacrylate, and the like; to provide pendant acid group corresponding monomers acid monomers can be reacted such as methacrylic acid and acrylic acid; and dissolution enhancers such as anhydrides which may be provided by reaction of suitable monomers such as itaconic anhydride and the like. See the examples which follow for exemplary reagents for synthesis of polymers of the invention.

Preferably a polymer of the invention suitably will have a weight average molecular weight ($M_w$) of 1,000 to about 100,000, more preferably about 2,000 to about 30,000, still more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

Polymers of the invention used in photoresist formulations should contain a sufficient amount of photogenerated acid labile ester groups to enable formation of resist relief images as desired. For instance, suitable amount of such acid labile ester groups will be at least 1 mole percent of total units of the polymer, more preferably about 2 to 50 mole percent, still more typically about 3 to 30 or 40 mole percent of total polymer units. See the examples which follow for exemplary preferred polymers.

As discussed above, further provided are photoresist compositions that comprise the described polymers as a resin binder component.

The photoresist compositions of the invention can provide highly resolved relief images upon exposure to short wavelengths, particularly 248 nm. The photoresists of the invention preferably are chemically-amplified positive resists, which utilize photoacid-induced cleavage of pendant alkyl ester polymer groups to provide solubility differentials between exposed and unexposed areas of a resist coating layer.

Polymers of the invention used in photoresist formulations should contain a sufficient amount of photogenerated acid labile ester groups to enable formation of resist relief images as desired. For instance, a suitable amount of such acid labile ester groups will be at least 1 mole percent of total units of the polymer, more preferably about 2 to 50 or 60 mole percent. See the examples which follow for exemplary preferred polymers.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 248 nm imaging include imidosulfonates such as compounds of the following formula:

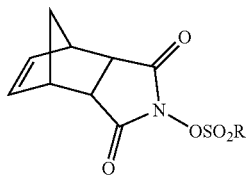

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

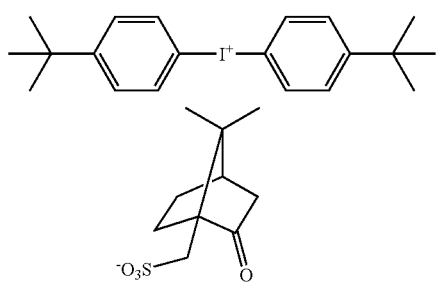

1

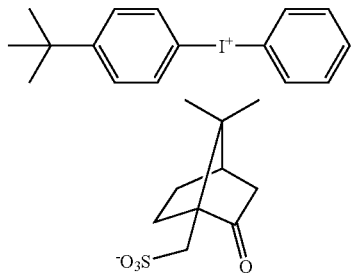

2

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3^-$ where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention.

A preferred optional additive of resists of the invention is an added base, particularly tetrabutylammonium hydroxide (TBAH), or tetrabutylammonium lactate, which can enhance resolution of a developed resist relief image. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly sub-300 nm exposure wavelengths such as 248 nm. However, the resist compositions of the invention also may be suitably imaged at higher wavelengths. For example, a resin of the invention can be formulated with an appropriate PAG and used as a chemically-amplified positive I-line resist, i.e. a resist imaged at about 365 nm. Resists of the invention also will be useful for exposure with electron beams (E-beam exposure) and extreme-UV exposure (EUW) such as sub-50 nm or sub-20 nm exposure, particularly 13 nm exposure.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLES 1-6

Syntheses of Cage and Lactone Monomers

Example 1

Synthesis of Ethyl Fenchol Methacrylate

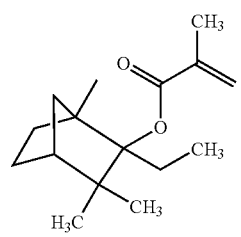

| Materials used: | Amount Charged | moles | Source |
|---|---|---|---|
| Ethyl fenchol | 182.31 g | 1.00 | Aldrich |
| n-BuLi (2.5 M in hexanes) | 440 mL | 1.10 | Aldrich |
| Methacryloyl chloride | 112.4 mL | 1.15 | Aldrich, distilled before use |
| THF anhydrous | 600 mL | | Aldrich, degassed before use |

Procedure:

All reaction glassware and needles were dried and flushed with dry $N_2$ before use and the reaction was carried out under nitrogen atmosphere.

1) Into a 2 L 3-neck RBF equipped with an addition funnel and a magnetic stirrer were added 182.31 g of 2-Ethyl fenchol and 600 mL of anhydrous THF. The resulting colorless solution was cooled with an ice-water bath.

2) A n-BuLi solution (440 mL) was transferred to the addition funnel via a double-tipped needle and then added to the cooled THF solution over 30 min. When added, the resulting yellowish solution was kept in the ice-water bath and stirred for 2 h.

3) Methacryloyl chloride (112.4 mL, 104.54 g) was added dropwisely over 20 min. The resulting yellow suspension was allowed to warm to room temperature and stirred overnight.

4) The LiCl salts were filtered off. The filtrate was cooled in an ice-water bath while 200 mL of pre-cooled DI water was added. The resulting solution was stirred for 1.5 h and the organic phase was isolated (some ether or THF may be added to assist extraction), washed with DI water (2×200 mL), then saturated $Na_2CO_3$ solution (2×200 mL), then DI water (3×200 mL) again, and dried over anhydrous $MgSO_4$.

5) The slightly yellow solution was concentrated on a rotary evaporator (bath temperature kept below 35°) to yield a clear slightly yellow liquid product. Yield >90%.

6) The crude EFMA may be purified to remove the yellow color plus methacrylic anhydride impurity via flash filtration through pre-conditioned silica (using hexanes) in Buchner. The monomer is eluted with hexanes only and comes through in the early eluting fractions as a colorless liquid when rotovapped. The product was shown to be pure by NMR.

Example 2

2-Methyl-2-adamantyl methacrylate

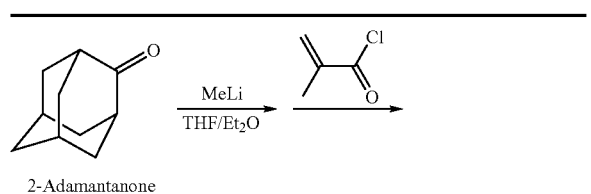

2-Adamantanone

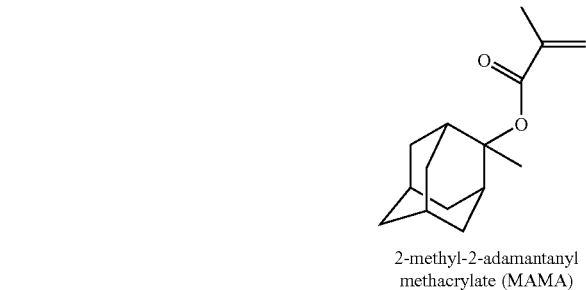

2-methyl-2-adamantanyl methacrylate (MAMA)

| Materials used: | Amount Charged | moles | Source |
|---|---|---|---|
| 2-Adamantanone | 150.22 g | 1.00 | Lancaster |
| MeLi (1.4 M in Ether) | 786 mL | 1.10 | Aldrich |
| Methacryloyl chloride | 112.4 mL | 1.15 | Aldrich, distilled before use |
| THF anhydrous | 600 mL | | Aldrich, degassed before use |

Procedure:

All reaction glassware and needles were dried and flushed with dry $N_2$ before use and the reaction was carried out under nitrogen atmosphere.

1) A Methyllithium solution (786 mL) was transferred via a double-tipped needle to a 2 L 3-neck RBF equipped with an addition funnel and a magnetic stirrer, and cooled with an ice-water bath.

2) 2-Adamantanone (150.22 g) was dissolved (over 0.5 h) in anhydrous THF (600 mL) and the resulting colorless solution was transferred to the addition funnel via a double-tipped needle and then added to the cooled MeLi solution over 30 min. When added, the resulting white suspension was allowed to warm to room temperature and stirred for 2 h.

3) The white suspension then was cooled using an ice-water bath and methacryloyl chloride (112.4 mL, 104.54 g) was added dropwisely over 20 min. The white solid faded out and a new white (LiCl) suspension formed. The resulting white suspension was allowed to warm to room temperature and stirred overnight.

4) The LiCl salts were filtered off. The filtrate was cooled in an ice-water bath while 200 mL of pre-cooled DI water was added. The resulting solution was stirred for 1.5 h and the organic phase was isolated (some ether or THF may be added to assist extraction), washed with DI water (2×200 mL), then saturated $Na_2CO_3$ solution (2×200 mL), then DI water (3×200 mL) again, and dried over anhydrous $MgSO_4$.

5) The slightly yellow solution was concentrated on a rotary evaporator (bath temperature kept below 35°) to yield a clear slightly yellow liquid product. Yield >90%.

6) The crude MAMA may be purified to remove the yellow color plus methacrylic anhydride impurity via flash filtration through preconditioned silica (using hexanes) in Buchner. The monomer is eluted with hexanes only and comes through in the early eluting fractions as a colorless liquid when rotovapped. The product was judged pure by NMR.

Example 3

Synthesis of 8-methyltricyclodecanyl methacrylate

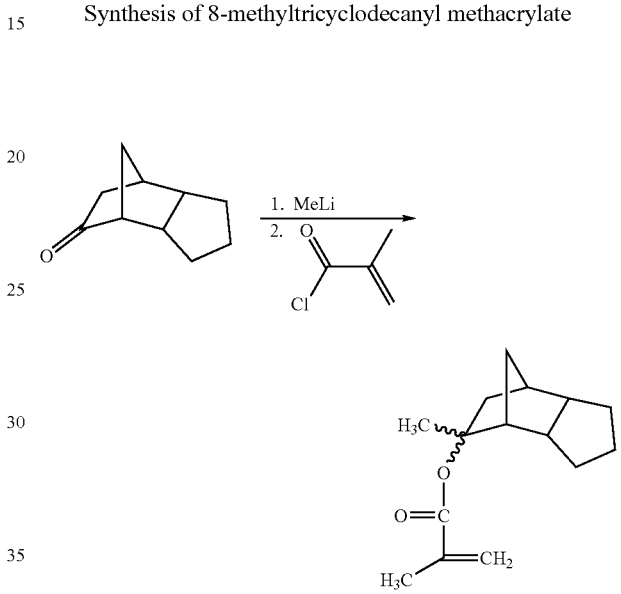

A solution of 125 ml of 1.4 M methyl lithium (in ethyl ether)I in 100 ml of hexane was decanted into a three neck round-bottom flask at an ice-water bath. To it, a solution of 24.00 g of tricyclo[5.2.1.0]decan-8-one in hexane was added dropwise. After addition, the reaction mixture was stirred for 4 hours at 0° C. Then, a solution of 16 ml of methacroyl chloride in 100 ml of hexane was added dropwise at 0° C. After addition, the reaction mixture was stirred at the same bath for overnight (16 hours). After filtering the white salts, the organic layer was washed with water three times (3×300 ml). Then, the washed organic layer was dried over anhydrous $MgSO_4$. The organic solvent was removed by a rotary pump to give the crude title monomer (23.5 g). The monomer was purified by a flash column chromatography (purity >98%, silica gel with hexane). $^1$H NMR: 6.05 (1H), 5.50 (1H), 1.95 (3H), 1.65 (3H), 2.25-0.85 (14H).

Example 4

Synthesis of tetrahydro-2-oxo-2-H-furan-4-yl methacrylate

The methacrylate monomer, tetrahydro-2-oxo-2-H-furan-4-yl methacrylate was synthesized in one step esterification from commercially available compound. A mixture of (S)-(−)-γ-hydroxy-γ-butyrolactone (41.77 g, 0.419 mole) and triethylamine (45.32 g, 0.449 mole) in 100 mL of dry THF was placed in a three-neck round-bottom flask under a dry nitrogen atmosphere at an ice-water bath. To it, a solution of distilled methacryloyl chloride (45 mL, 0.461 mole) in 200 ML of dry THF was added slowly (about 1 hour). During the addition, white precipitation (triethylamine salt) was observed in the reaction mixture. The reaction mixture was stirred over night (about 18 hour). The resultant mixture was filtered, and the filtrate was concentrated by a rotary pump. The concentrated mixture was added 500 mL of ethyl acetate and washed with water (2×500 mL) twice. The organic layer was dried with anhydrous MgSO$_4$ and concentrated by a rotary pump. The purification of the crude monomer by column chromatography (neutral aluminum oxide, 300 g, hexane, then hexane/EtoAc=1/1). The purity of the monomer is about 95% (by NMR) and 52% yield. $^1$H NMR (CDCl3, ppm): 6.20 (1H), 5.70 (1H), 5.55 & 4.95 (1H), 4.55 (dd, 1H), 4.4 (d, 1H), 2.90 (dd, 1H), 2.70 (d, 1H), 1.95 (3H). $^{13}$C NMR (CDCl3, ppm): 174.1, 166.5, 135.5, 126.8, 72.9, 70.0, 34.5, 17.9.

Example 5

Alpha-Butyrolactone Methacrylate Synthesis

To a 250 ml 3N-RB flask fitted with a gas inlet, thermometer, overhead stirrer and a 125 ml pressure equalizing dropping funnel was added 26.5 g triethylamine. The triethylamine was cooled to 5° C. using a water/ice bath. Once the triethylamine was at 5° C. the methacrylic acid was added dropwise over a 20-25 min period. The mixture exothermed ~10° C. After the addition was complete the water/ice bath was removed. While the solution was stirring (20 min) the dropping funnel was removed and replaced with a clean 125 ml pressure equalizing dropping funnel. The bromolactone (41.25 g)/THF (62.5 ml) was added dropwise over a 30 min. The mixture warmed from ~18° C. to ~30° C. with a precipitate forming. The reaction was heated to 55° C. and held at 55° C. for 16 hrs using an oil bath/hot plate. After heating for 16 hrs the mixture was cooled to 20° C. using a water/ice bath. The solid (44.5 g) was removed by vacuum filtration. The filtrates were reduced under partial pressure at 33-34° C. The resulting dark amber/brown oil was diluted with 90 g of methylene chloride. This solution was slowly poured onto a plug of silica gel (180 g, Baker 40 um flash chromatography packing) which had been pre-conditioned with methylene chloride. The crude mixture was allowed to pass into the silica gel plug by gravity. Once the crude mixture had passed the surface of the silica gel plug a fresh portion of methylene chloride was slowly poured onto the plug. The methylene chloride was pulled through the silica gel plug using reduced pressure. Once the methylene chloride had passed the surface of the silica gel plug the vacuum was removed then the next portion of methylene chloride was slowly poured onto the plug. This procedure was followed until all the product was extracted. The total filtrate was 850 ml. [The product was detected by spotting an aliquot on a TLC plate then illuminating with short UV.] To the orange filtrate was added 36 g of activated charcoal. The mixture was stirred for 1.5 hrs then filtered through a Celite plug (pre-conditioned with methylene chloride). The charcoal/Celite was washed with (2×100 ml, 1×50 ml methylene chloride). The filtrate was then washed with 2×200 ml D.I. water. The layers were separated and the organic layer was dried over 100 g of sodium sulfate. The mixture was stirred for 15-30 min. The sodium sulfate was removed and washed with 2×50 ml methylene chloride. The pale yellow filtrate (1.2 L) was stripped under reduced pressure at 33-34° C. leaving 36.4 g of a pale orange oil, Yield 85.6%.

Example 6

Synthesis of Pinanyl Methacrylate

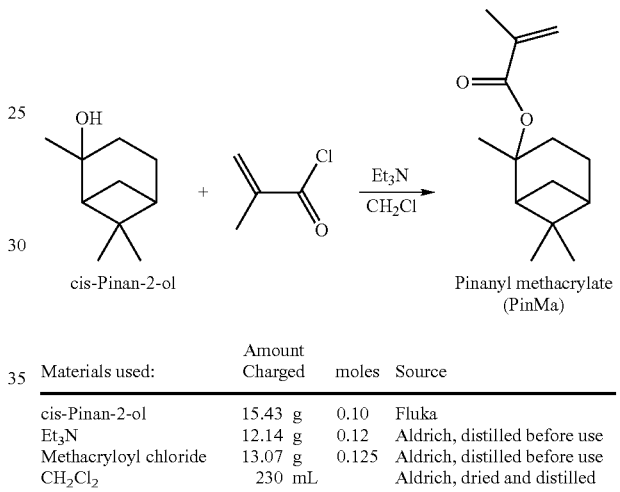

cis-Pinan-2-ol          Pinanyl methacrylate
                              (PinMa)

| Materials used: | Amount Charged | moles | Source |
|---|---|---|---|
| cis-Pinan-2-ol | 15.43 g | 0.10 | Fluka |
| Et$_3$N | 12.14 g | 0.12 | Aldrich, distilled before use |
| Methacryloyl chloride | 13.07 g | 0.125 | Aldrich, distilled before use |
| CH$_2$Cl$_2$ | 230 mL | | Aldrich, dried and distilled |

Procedure:

All reaction glassware and needles were dried and flushed with dry N$_2$ before use and the reaction was carried out under nitrogen atmosphere.

1) Into a 500 mL 3-neck round-bottom-flask equipped with an addition funnel and a magnetic stirrer were added 15.43 g of cis-pinan-2-ol and 200 μL of dry CH$_2$Cl$_2$ (Stirred over CaH$_2$ overnight, then distilled and stored over activated molecular sieves). The resulting colorless solution was cooled with an ice-water bath.

2) Triethylamine (12.14 g) was added through the addition funnel to the cooled CH$_2$Cl$_2$ solution over 10 min. After added, the resulting solution was kept in a dry-ice/acetone bath (−67° C.).

3) A CH$_2$Cl$_2$ (30 mL) solution of methacryloyl chloride (13.07 g) was added dropwisely over 20 min. The resulting orangish suspension was allowed to warm to room temperature and stirred for 2 h.

4) The chloride salts were filtered off. The filtrate was washed with saturated Na$_2$CO$_3$ solution (2×200 mL), then DI water (3×200 mL), and dried over anhydrous MgSO$_4$.

5) The slightly yellow CH$_2$Cl$_2$ solution was concentrated on a rotary evaporator (bath temperature kept below 35°) to yield a clear slightly yellow liquid product. Yield=79%. The product was judged pure by NMR.

Example 7

Synthesis of Polymers of the Invention

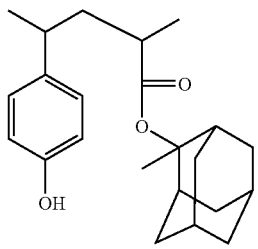

Three polymers (Polymers 1-3) of phenol (polymerized p-hydroxystyrene) and 2-methyladamantylmethacrylate (no other units) were prepared at 10,000 Mw. Polymer 1 contained 85 mole percent of phenol units and 15 mole percent of 2-methyladamantyl methacrylate units; Polymer 2 contained 80 mole percent of phenol units and 20 mole percent of 2-methyladamantyl methacrylate units; and Polymer 3 contained 75 mole percent of phenol units and 25 mole percent of 2-methyladamantyl methacrylate units. A fourth terpolymer (Polymer 4) was prepared at 10,000 Mw that had 65 mole percent of phenol units (polymerized p-hydroxystyrene), 20 mole percent of phenyl units (polymerized styrene), and 15 mole percent of 2-methyladamantyl methacrylate units.

Example 8

Photoresist Preparation and Lithographic Results

A photoresist of invention (Photoresist 1) was prepared by admixing the following components at 12.5% solids in ethyl lactate (solids ratio is expressed as weight percents of each component based on all components of the resist, except ethyl lactate solvent). Photoresist 1 contained Polymer 1 as that polymer is described in Example 1 above.

| Resist Component | Solids Ratios |
| --- | --- |
| PHS/MAMA Copolymer (80:20) (Polymer 1) | 94.40 |
| Di-t-butyl phenyl iodonium camphorsulfonate | 4.72 |
| Tetrabutyl ammonium lactate | 0.38 |
| Silwet 7604 surfactant (from Union Carbide) | 0.50 |

A further photoresist of invention (Photoresist 2) was prepared by admixing the following components at 12.5% solids in ethyl lactate (solids ratio is expressed as weight percents of each component based on all components of the resist, except ethyl lactate solvent). Photoresist 2 contained Polymer 4 as that polymer is described in Example 1 above.

| Resist Component | Solids Ratios |
| --- | --- |
| Phenol/Styrene/MAMA Terpolymer (Polymer 4) | 94.40 |
| Di-t-butyl phenyl iodonium camphorsulfonate | 4.72 |
| Tetrabutyl ammonium lactate | 0.38 |
| Silwet 7604 surfactant (from Union Carbide) | 0.50 |

The above Photoresists 1 and 2 were spin coated onto 6" silicon wafers (pre-coated with an antireflective coating AR3, from Shipley Company) on a TEL Mark 8 track (from Tokyo Electron Limited) to achieve a thickness of about 4000 Å and baked at 130° C. for 60 sec. The coated wafers were exposed on an GCA XLS 7800 DUV stepper (0.53 NA, 0.74σ used) equipped with a KrF laser (248 nm) for a lines/spaces test pattern, followed by 130° C. post exposure bake for 90 sec. and development with an aqueous alkaline developer solution. The developed wafers were cross-sectioned and evaluated by scanning electron microscope (SEM) for exposure latitude and focus latitude using 1:1 lines/spaces patterns. Each of Resists 1 and 2 provided well resolved images at 180 nm for 1:1 lines/spaces.

Example 9

Additional Lithographic Results

Photoresist 1 prepared in Example 7 above was spin coated onto 6 inch silicon wafer (pre-coated with an antireflective coating AR3, from Shipley Company) on a TEL Mark 8 track (from Tokyo Electron Limited) to achieve a thickness of about 4000 Å and baked at 130° C. for 60 see. The coated wafer was exposed on an ASM PAS 5500 stepper (0.63 NA, 0.75σ used) equipped with a KrF laser (248 mm) for a lines/spaces test pattern, followed by post exposure bake for 90 sec. and development with CD-26 developer (from Shipley Company). Three wafers were coated and processed, with each having a different PEB temperature (130, 135, and 140° C., respectively). The developed wafers were cross-sectioned and evaluated by scanning electron microscope for exposure latitude and focus latitude using 1:1 lines/spaces patterns at 130, 140, and 150 nm feature sizes. Photoresist 1 provided highly resolved 130 nm features for 1:1 lines/spaces.

Example 10

Synthesis of Phenolic/Tricyclodecanyl Ester (Copolymer 5) Photoresist Preparation and Lithographic Results Copolymer 5:

The above phenolic/tricyclodecanyl ester polymer (copolymer 5) was prepared as follows. A mixture of 8-methyl-tricyclo[5.2.1.0]decanyl methacrylate (5.03 g), 4-acetoxystyrene (10.44 g), and AIBN (0.57 g) in 40 mL of isopropanol was placed in a round-bottomed flask. Then, the flask was put into a pre-heat 90° C. oil bath. The reaction mixture was stirred at this temperature for 18 hours. Then, to the reaction mixture, 10 ml of 10 M NH$_4$OAc (aq) was added. The reaction mixture was stirred and heated for another 20 hours. After cooling, the polymer was isolated by precipitation into 700 g of water. The suspended polymer was stirred for 60 minutes. Then, the polymer was filtered off and washed the polymer by additional 100 mL of hexane. The polymer was dried in a vacuum oven at 50° C. for 24 hours. Yields=91%. Tg: 144° C., Mw: 10,000. OD: 0.235/micron (248 nm).

A photoresist composition of the invention ("Copolymer 5 Resist") was prepared by admixing the following components at 12.5% solids in ethyl lactate (solids ratio is expressed as weight percents of each component based on all components of the resist, except ethyl lactate solvent).

| Resist Component | Solids Ratios |
| --- | --- |
| phenolic/tricyclo decanyl ester polymer (copolymer 5 shown above) (80 mole % phenolic:20 mole % tricyclo decanyl ester) | 94.40 |
| Di-t-butyl phenyl iodonium camphorsulfonate | 4.72 |
| Tetrabutyl ammonium lactate | 0.38 |
| Silwet 7604 surfactant (from Union Carbide) | 0.50 |

The above "Copolymer 5 Resist" prepared above was spin coated onto 6 inch silicon wafer (pre-coated with an antireflective coating AR3, from Shipley Company) on a TEL Mark 8 track (from Tokyo Electron Limited) to achieve a thickness of about 4500 Å and baked at 130° C. for 60 sec. The coated wafer was exposed on an ASM PAS 5500 stepper (0.63 NA, 0.75σ used) equipped with a KrF laser (248 nm) for a lines/spaces test pattern, followed by post exposure bake for 90 sec. and development with 0.26 N tetrabutylammonium hydroxide aqueous solution. Three wafers were coated and processed, with each having a different PEB temperature (130, 135, and 140° C., respectively). The developed wafers were cross-sectioned and evaluated by scanning electron microscope for exposure latitude and focus latitude using 1:1 lines/spaces patterns at 130, 140, and 150 nm feature sizes. Highly resolved 130 nm features for 1:1 lines/spaces were obtained.

Example 11

Dissolution Rate Tests

Selected polymers were evaluated for dissolution rates in 0.26N tetrabutylammonium hydroxide aqueous solution. Results are set forth in Table 1 below. The following standard protocol was employed: a liquid formulation of the polymer was spin coated onto silicon wafers and solvent removed at 130° C. for 1 minute. Polymer film thicknesses were about 1.0 μM. Dissolution rates of the polymer films were measured by immersion of the coated wafer in 0.26N tetramethylammonium hydroxide aqueous solution using a Perkin-Elmer 5900 Development Rate Monitor.

TABLE 1

Dissolution Rates of 80/20 Copolymers in 0.26N TMAH.

| R Group | Dissolution Rate of Copolymer Film (angstrom/second) |
| --- | --- |
| t-butyl | 150.0 |
| 2,3,3-trimethyl bicyclic (fencyl-type) | 3.8 |
| adamantyl | 1.5 |
| tricyclodecanyl | <1.0 |

The foregoing description of the invention is merely illustrative thereof, and it is understood that variations and modification can be made without departing from the spirit or scope of the invention as set forth in the following claims.

What is claimed is:

1. A photoresist composition comprising a photoactive component and a resin component comprising a polymer that comprises repeat units of 1) a photoacid labile ester group that comprises a tertiary ester alicyclic group that has a molecular volume of at least about 125 cubic angstroms; 2) a phenolic group; and 3) a cyano group.

2. The photoresist composition of claim 1 wherein the alicyclic group contains a single ring.

3. The photoresist composition of claim 1 wherein the alicyclic group comprises two or more fused or bridged rings.

4. The photoresist composition of claim 1 wherein the alicyclic group is optionally substituted alkyladamantyl, optionally substituted fencyl, optionally substituted tricyclo decanyl, or optionally substituted pinanyl.

5. The photoresist composition of claim 1 wherein the polymer consists of repeat units of 1) a photoacid labile ester group that comprises a tertiary ester alicyclic group that has a molecular volume of at least about 125 cubic angstroms; 2) a phenolic group; and 3) a cyano group.

6. The photoresist composition of claim 1 wherein the photoacid labile group comprises an alkyl adamantly group.

7. The photoresist composition of claim 1 wherein the polymer comprises meta-phenol group.

8. A method of forming a positive photoresist relief image, comprising:

applying a coating layer of a photoresist composition on a substrate, the photoresist composition comprising a photoactive component and a resin component comprising a polymer that comprises repeat units of 1) a photoacid labile ester group that comprises a tertiary ester alicyclic group that has a molecular volume of at least about 125 cubic angstroms; 2) a phenolic group; and 3) a cyano group; and exposing and developing the photoresist composition layer to yield a relief image.

9. The method of claim 8 wherein the photoresist layer is exposed with radiation having a wavelength of about 248 nm.

10. The photoresist composition of claim 1 wherein the alicyclic group is optionally substituted alkyladamantyl.

11. A method of forming a positive photoresist relief image, comprising:

applying a coating layer of a photoresist on a substrate, the photoresist composition comprising a photoactive component and a resin component comprising a polymer that comprises repeat units of 1) a photoacid labile ester group that comprises an optionally substituted alkyladamantyl group; 2) a phenolic group; and 3) a cyano group; and exposing the photoresist composition layer to radiation having a wavelength of 248 nm and developing the photoresist layer to yield a relief image.

12. The method of claim 8 wherein the alicyclic group contains a single ring.

13. The method of claim 8 wherein the alicyclic group comprises two or more fused or bridged rings.

14. The method of claim 8 wherein the alicyclic group is optionally substituted alkyladamantyl, optionally substituted fencyl, optionally substituted tricyclo decanyl, or optionally substituted pinanyl.

15. The method of claim 8 wherein the polymer consists of repeat units of 1) a photoacid labile ester group that comprises a tertiary ester alicyclic group that has a molecular volume of at least about 125 cubic angstroms; 2) a phenolic group; and 3) a cyano group.

* * * * *